United States Patent
Isobe

(10) Patent No.: US 8,225,924 B2
(45) Date of Patent: Jul. 24, 2012

(54) NON-CONTACT CONVEYANCE SYSTEM

(75) Inventor: Hiromi Isobe, Nagano (JP)

(73) Assignee: Institute of National Colleges of Technology, Japan, Hachioji-shi, Tokyo (JP)

( * ) Notice: Subject to any disclaimer, the term of this patent is extended or adjusted under 35 U.S.C. 154(b) by 194 days.

(21) Appl. No.: 12/920,543

(22) PCT Filed: Mar. 5, 2009

(86) PCT No.: PCT/JP2009/054175
§ 371 (c)(1),
(2), (4) Date: Sep. 1, 2010

(87) PCT Pub. No.: WO2009/110552
PCT Pub. Date: Sep. 11, 2009

(65) Prior Publication Data
US 2011/0011704 A1    Jan. 20, 2011

(30) Foreign Application Priority Data

Mar. 5, 2008    (JP) .................. 2008-054570

(51) Int. Cl.
*B65G 49/07* (2006.01)
*B65G 27/32* (2006.01)
*H01L 21/677* (2006.01)

(52) U.S. Cl. .............. 198/752.1; 198/468.5; 198/630; 198/763

(58) Field of Classification Search ............ 198/468.5, 198/619, 630, 752.1, 763, 769; 406/88; 414/676
See application file for complete search history.

(56) References Cited

U.S. PATENT DOCUMENTS

| | | | | |
|---|---|---|---|---|
| 5,238,303 A | * | 8/1993 | Dixon | 366/218 |
| 5,810,155 A | * | 9/1998 | Hashimoto et al. | 198/630 |
| 6,402,436 B1 | * | 6/2002 | Murphy | 406/86 |
| 6,575,669 B2 | * | 6/2003 | Takasan | 406/197 |
| 6,609,609 B2 | * | 8/2003 | Takasan et al. | 198/630 |
| 6,994,207 B2 | * | 2/2006 | Takasan et al. | 198/752.1 |
| 8,106,330 B2 | * | 1/2012 | Arao et al. | 219/121.82 |
| 2003/0034228 A1 | | 2/2003 | Takasan et al. | |

FOREIGN PATENT DOCUMENTS

| | | |
|---|---|---|
| JP | 9-169427 | 6/1997 |
| JP | 2002-128257 | 5/2002 |
| JP | 2003-128228 | 5/2003 |
| JP | 2006-076690 | 3/2006 |

* cited by examiner

*Primary Examiner* — Douglas Hess
(74) *Attorney, Agent, or Firm* — Jordan and Hamburg LLP

(57) ABSTRACT

A non-contact conveyance system of the invention has a static pressure table for levitating a conveyance object upward, a pair of conveying units having vibrating plates and actuators and a moving unit for moving the conveying units in a conveying direction. Then, retaining forces are applied to front and rear edge portions of the conveyance object facing to the vibrating plates by exciting deflection standing waves in the vibrating plates by the actuators. Then, when the conveying units are moved while applying the retaining forces to the edge portions of the conveyance object, the conveyance object is conveyed following the move of the conveying units. Thereby, a number of parts may be cut and the system may be downsized.

6 Claims, 7 Drawing Sheets

NON-CONTACT CONVEYANCE SYSTEM

BACKGROUND OF THE INVENTION

The present invention relates to a non-contact conveyance system for conveying flat objects to be conveyed such as a mother glass substrate and a semiconductor wafer substrate in non-contact.

While numbers of productions of flat panel displays such as liquid crystal displays, plasma displays and touch panel displays are increasing lately, such flat panel displays are also growing in size. Still more, because a cost per panel is determined by a number of panels taken out of one mother glass, i.e., a number of planes that can be taken out, the size of the mother glass substrate is growing year by year. The semiconductor wafer substrates are also being made thinner rapidly. Accordingly, a drop of yield of the thin mother glass substrates and semiconductor wafer substrates caused by damages that occur during their conveyance is posing a problem. Thus, during their conveyance, they require, as preferable conditions, not to be stained, no stress to be applied and no damage to be given.

Hitherto, such substrates are conveyed by way of a contact conveyance method using conveyor rollers, a folk lift and the like. However, when the size of the substrates grows as described above, it is necessary to increase a number of rollers or a number of folks of the conveyor roller, folk lift and the like of the contact conveyance method to alleviate stress applied to the substrates corresponding to the growing size, a considerable amount of works is required to strictly adjust, control and maintain levels of the large number of rollers and folks.

Then, there has been proposed a non-contact conveyance system that levitates an object to be conveyed (referred to as a 'conveyance object' hereinafter) on a conveying path by pressure of fluid discharged from the underside by a fluid pressure levitating section and conveys the conveyance object levitated on the conveying path in a predetermined direction by an acoustic viscous flow generated between resilient vibrating plates exciting deflection traveling waves and the surface of the conveyance object (see Japanese Patent Application Laid-open No. 2006-76690 Gazette for example). This non-contact conveyance system is provided with a large number of driving units each composed of the resilient vibrating plate and an exciting actuator and disposed along the conveying path.

SUMMARY OF THE INVENTION

However, because the non-contact conveyance system described above is required to dispose the large number of driving units each composed of the resilient vibrating plate and the exciting actuator along the conveying path, the size of the system grows remarkably. Still more, because the system is composed of a large number of parts, the system is costly.

Accordingly, the present invention aims at providing a non-contact conveyance system that is capable of conveying conveyance objects in non-contact while downsizing the system by cutting a number of parts. The invention provides a non-contact conveyance system for conveying objects (S) in a conveying direction (see, FIGS. 1, 2, 6 and 7 for example) having;

a levitating section (1) for levitating the conveyance object (S), a moving section (20, 120) for moving in the conveying direction;

a conveying section (10A, 10B, 110A, 110B, 210) having a vibrating plate (11, 111, 211) disposed so as to face to the conveyance object in non-contact and an actuator (12) for applying vibrations to the vibrating plate to excite deflection standing waves;

the conveying section being supported by said moving section (20, 123);

wherein the conveying section applies a retaining force that attracts to and retains the conveyance object at positions facing to the vibrating plate (11, . . . ) to at least one edge portion among front and rear edge portions (Sa) and (Sb) of the conveyance object (S) facing to the vibrating plate (11, . . . ) by exciting deflection standing waves in the vibrating plate (11, . . . ) by the actuator (12), and the moving section (29, 120) moves the conveying section (10A, 10B, . . . ) in the conveying direction to convey the conveyance object in the conveying direction following the move of the conveying section while applying the retaining forces to the edge portion (Sa, Sb) of the conveyance object.

Thus, the non-contact conveyance system of the invention can convey the conveyance object in non-contact by conveying while applying the retaining force to the edge portion of the conveyance object and conveys the conveyance object following the move of the conveying section by moving the conveying section by the moving section. Accordingly, it becomes unnecessary to dispose a large number of vibrating plates that excite deflection traveling waves along the conveying direction. Then a number of parts may be cut and the system may be downsized.

In the non-contact conveyance system, the conveying section (10A, 10B, . . . ) has, as the vibrating plate, a front edge vibrating plate (11A, 111A, 211A) disposed so as to face to the front edge portion (Sa) of the conveyance object and a rear edge vibrating plate (11B, 111B, 211B) disposed so as to face to the rear edge portion (Sb) of the conveyance object.

Thus, the vibrating plates are disposed so as to face to the front and rear edge portions of the conveyance object, so that the retaining force to the conveyance object may be enhanced and the conveyance object may be conveyed stably in non-contact by the both vibrating plates.

The non-contact conveyance system further includes (see FIGS. 1 and 2 for example) restricting sections (10C, 10D) having side edge vibrating plates (11C, 11D) disposed so as to face to side edge portions (Sc, Sd) of the conveyance object in non-contact and side edge actuators (12C, 12D) for applying vibrations to the side edge vibrating plates to excite deflection standing wave, and the restricting sections restrict the conveyance object from moving in the widthwise direction orthogonal to the conveying direction by applying retaining forces that attract to and retain the conveyance object at positions facing to the side edge vibrating plates (11C, 11D) to the side edge portions (Sc, Sd) of the conveyance object facing to the side edge vibrating plates (11C, 11D) by exciting the deflection standing waves in the side edge vibrating plates (11C, 11D) by the side edge actuators (12C, 12D).

Because the restricting, sections are thus provided, it is possible to suppress the conveyance object from falling out in non-contact without providing any contact-type guides and to avoid the conveyance object from being stained or damaged otherwise caused by contact.

In the non-contact conveyance system, the moving section (20, 123) supports the restricting sections (10C, 10D) and moves the restricting sections (10C, 10D) together with the conveying section (10A, 10B) in the conveying direction.

The restricting sections are thus moved by the moving section, so that it becomes unnecessary to provide a large number of vibrating plates that excite deflection standing waves along the conveying direction. Accordingly, the number of parts may be cut and the system may be downsized.

In the non-contact conveyance system (see FIG. 6 for example), the vibrating plates (111A, 111B) extend in the widthwise direction orthogonal to the conveying direction so as to cover the whole edge portions (Sa, Sb) of the conveyance object, the conveying section applies a retaining force that attracts to and retains the conveyance object at positions facing to the vibrating plates (111A, 111B) to the edge portions (Sa, Sb) of the conveyance object facing to the vibrating plates (111A, 111B) by exciting deflection standing waves having a plurality of antinodes in the widthwise direction of the vibrating plates (111A, 111B) by the actuators (12), the moving section (123) moves the conveying section (110A, 110B) in the conveying direction to convey the conveyance object in the conveying direction following the move of the conveying section (110A, 110B) while applying the retaining forces to the edge portions (Sa, Sb) of the conveyance object, and the conveying section applies the retaining forces to corners of the edge portions of the conveyance object to restrict the conveyance object from moving in the widthwise direction orthogonal to the conveying direction. Thereby, the conveying section having the vibrating plates extending in the widthwise direction can restrict the conveyance object from moving in the widthwise direction, so that no other restricting section needs to be provided. Accordingly, the number of parts may be cut and the system may be downsized further. Still more, because it is possible to suppress the conveyance object from falling out in non-contact without providing contact-type guides, it is possible to avoid the conveyance object from being stained or damaged otherwise caused by contact.

In the non-contact conveyance system (see FIG. 7 for example), the front edge and rear edge vibrating plates (211A) and (211B) are also linked to form a ringed vibrating plate (211) formed into the shape of a ring so as to face to a circumferential edge portion (Sc) of the conveyance object in non-contact, the conveying section applies retaining forces that attract to and retain the conveyance object at positions facing to the ringed vibrating plate (211) to the circumferential edge portion of the conveyance object facing to the ringed vibrating plate (211) by exciting deflection standing waves having a plurality of antinodes in the circumferential direction in the ringed vibrating plate (211) by the actuators (12), the moving section moves the conveying section (210) in the conveying direction to convey the conveyance object in the conveying direction following the move of the conveying section (210) while applying the retaining forces to the circumferential edge portion of the conveyance object, and the conveying section restricts the conveyance object from moving in the widthwise direction orthogonal to the conveying direction.

Thereby, the conveying section having the ringed vibrating plates can restrict the conveyance object from moving in the widthwise direction, so that no other restricting section needs to be provided. Accordingly, the number of parts may be cut and the system may be downsized further. Still more, because it is possible to suppress the conveyance object from falling out in non-contact without providing contact-type guides, it is possible to avoid the conveyance object from being stained or damaged otherwise caused by contact.

It is noted that the reference numerals within the parentheses above are provided to collate with the drawings and to facilitate understanding of the invention for descriptive purposes and do not affect the structure of scopes of claims by any means.

DETAILED DESCRIPTION OF THE INVENTION

Specific embodiments of the invention will be explained below with reference to the drawings.

[First Embodiment]

Figure 1:
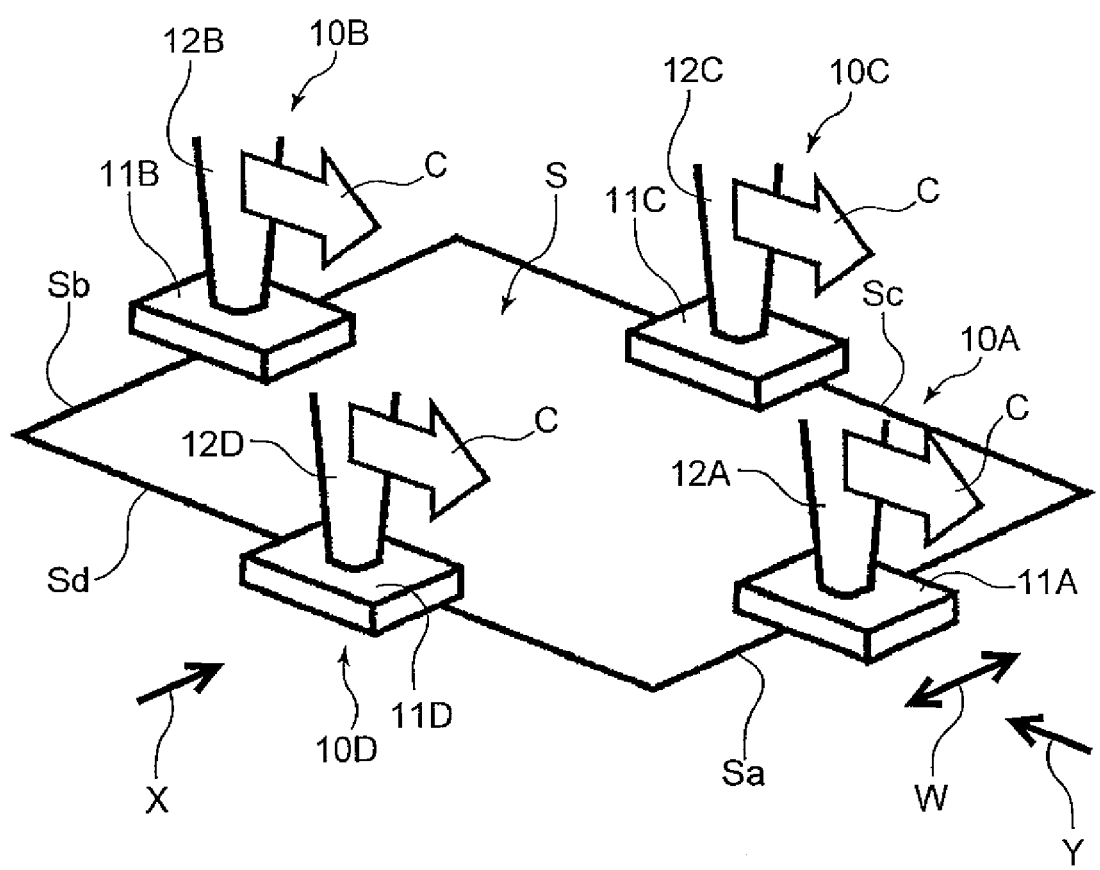
FIG. 1 is an explanatory view illustrating an outline of a main part of a non-contact conveyance system according to a first embodiment of the invention.
Figure 2:
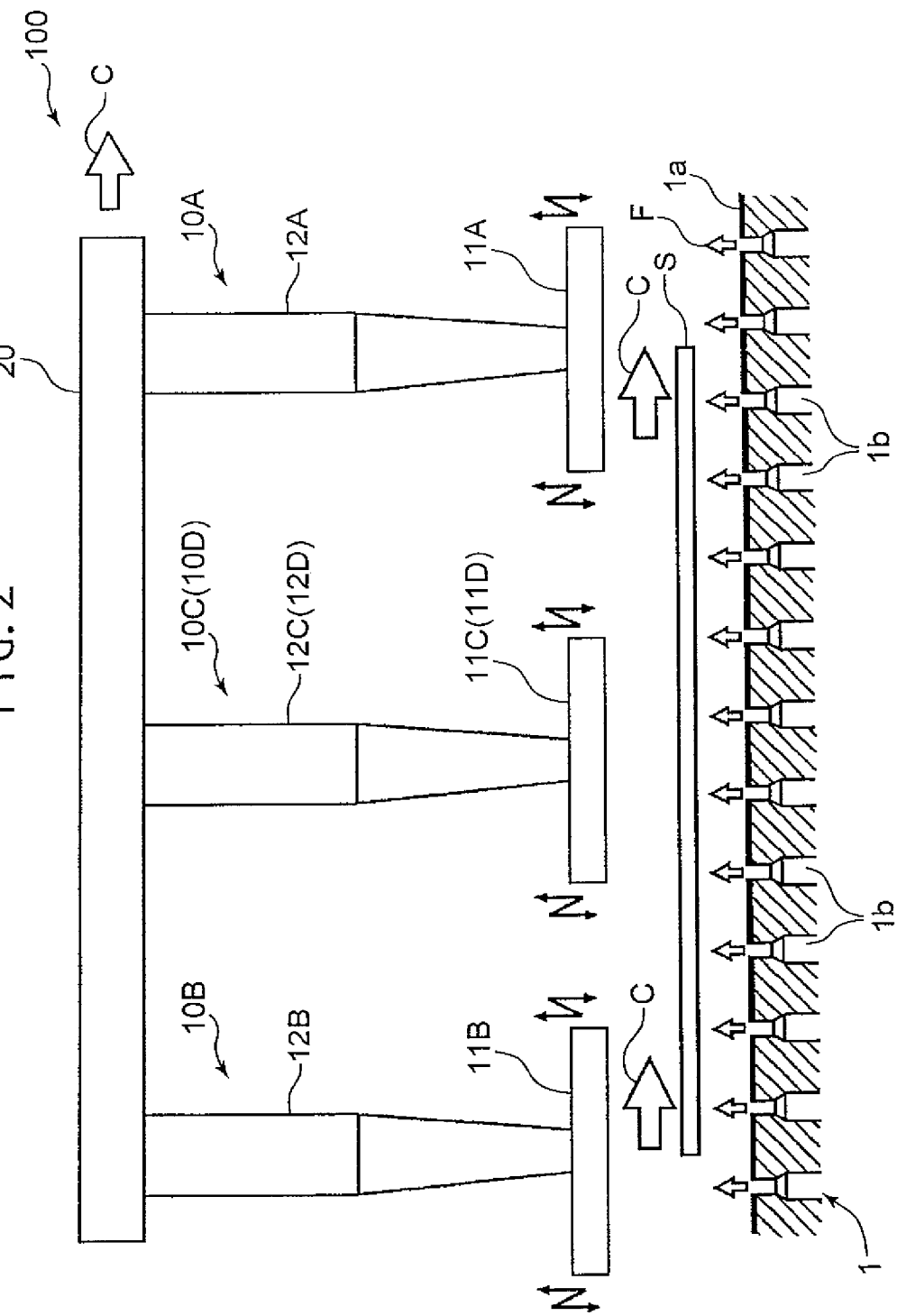
FIG. 2 is an explanatory view illustrating the non-contact conveyance system seen from the direction of an arrow X in FIG. 1.

FIG. 1 is an explanatory view illustrating an outline of a main part of a non-contact conveyance system according to a first embodiment of the invention and FIG. 2 is an explanatory view illustrating the non-contact conveyance system seen from the direction of an arrow X in FIG. 1.

In FIGS. 1 and 2, a conveyance object (an object to be conveyed) S is a flat panel such as a mother glass substrate and a semiconductor wafer for use as a flat panel display and is formed substantially into a rectangular shape in the first embodiment.

As shown in FIG. 2, the non-contact conveyance system 100 is provided with a static pressure table 1 as a levitating section for levitating the conveyance object upward by fluid such as air. The static pressure table 1 extends along a direction (in the direction of an arrow C) in which the conveyance object S is to be conveyed. An upper surface 1a of the static pressure table 1 is formed as a horizontal plane and the static pressure table 1 is provided with a large number of vertical discharging ports 1b opened to an upper surface 1a thereof to discharge the fluid F such as air upward. Thereby, the conveyance object S is levitated above the static pressure table 1 by pressure of the fluid F such as air discharged upward out of the large number of discharging ports 1b and is put into a state non-contact with respect to the static pressure table 1 located underneath thereof. The non-contact conveyance system 100 is also provided with a pair of conveying units 10A and 10B as conveying section for conveying the conveyance object S in the conveying direction (in the direction of the arrow C) in non-contact, a pair of restricting units 10C and 10D as restricting sections for restricting the conveyance object S from moving in a widthwise direction (in the direction of an arrow W) orthogonal to the conveying direction and a moving unit 20 as a moving section supporting and moving the respective units 10A, 10B, 10C and 10D in the conveying direction (in the direction of the arrow C).

The respective conveying units 10A and 10B are disposed at positions apart in the conveying direction by a distance corresponding to a length of the conveyance object S in the conveying direction. Further, the restricting units 10C and 10D are disposed at positions apart in the widthwise direction by a distance corresponding to a length in the widthwise direction orthogonal to the conveying direction of the conveyance object S. The respective units 10 are positioned at the respective edges of the conveyance object S so as to substantially face to the center.

One conveying unit (front edge conveying unit) 10A has a front edge vibrating plate 11A disposed above the static pressure table 1 so as to face to the upper part of a front edge portion Sa of the conveyance object S in non-contact and a front edge actuator 12A that applies vibrations to the front edge vibrating plate 11A to excite deflection standing waves. The other conveying unit (rear edge conveying unit) 10B has a rear edge vibrating plate 11B disposed above the static pressure table 1 so as to face to the upper part of a rear edge portion Sb of the conveyance object S in non-contact and a rear edge actuator 12B that applies vibrations to the rear edge vibrating plate 11B to excite deflection standing waves.

The respective restricting units 10C and 10D also have side edge vibrating plates 11C and 11D disposed above the static pressure table 1 so as to respectively face to the corresponding one of the both side edge portions Sc and Sd of the conveyance object S in non-contact and side edge actuators 12C and 12D that apply vibrations to the side edge vibrating plates 11C and 11D to excite deflection standing wave.

The vibrating plates 11 (11A, 11B, 11C and 11D) and the actuators 12 (12A, 12B, 12C and 12D) in the respective units 10 are constructed in the same manner to make the members in common.

Figure 3:
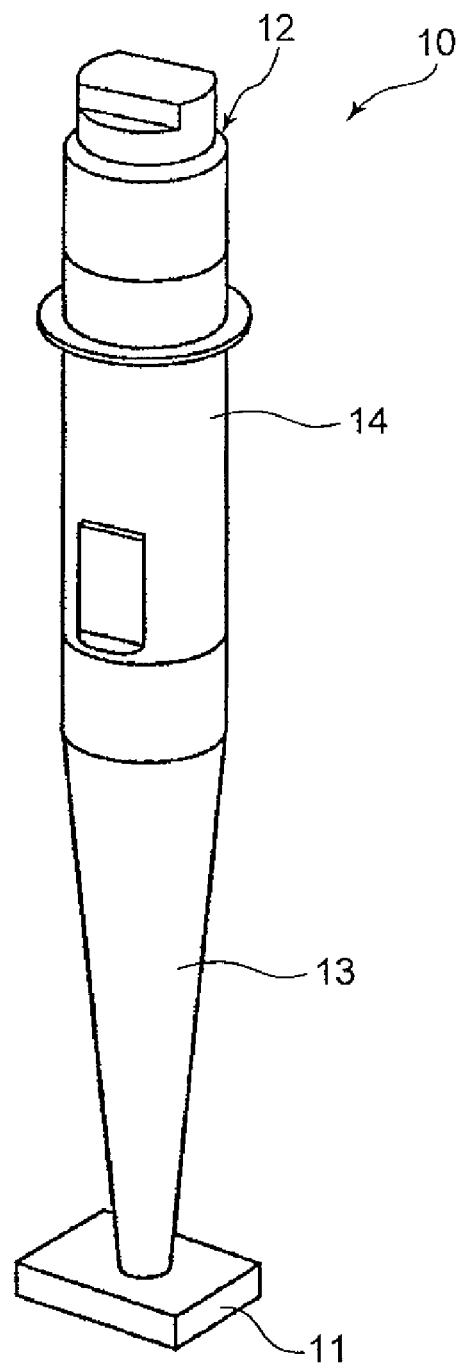
FIG. 3 is an explanatory view showing a structure of each unit.

The structure of each unit 10 will be explained in detail. FIG. 3 is an explanatory view showing the structure of each unit 10.

As shown in FIG. 3, the vibrating plate 11 is a plate member formed substantially into a rectangular shape whose lengths in the conveying direction and widthwise direction are shorter than those of the conveyance object S. The actuator 12 has a horn 13, made of an aluminum round rod, for magnifying vibrations and a bolted Langevin-type transducer (BLT) 14. The edge of the actuator 12, i.e., the edge of the horn 13, is junctioned and secured to the center part of the surface of the vibrating plate 11. Then, ultrasonic vibration is magnified through the horn 13 when voltage is applied to the BLT 14 and is propagated to the vibrating plate 11. The respective units 10 are arranged such that the edges of the respective actuators 12 face to the respective edge portions Sa through Sd of the conveyance object as shown in FIG. 1 and such that base ends of the respective actuators 12 are supported by the moving unit 20 as shown in FIG. 2. Then, when the moving unit 20 moves in the conveying direction, the respective units 10 move in the conveying direction (in the direction of the arrow C) while keeping the same distances from each other.

Figure 4:
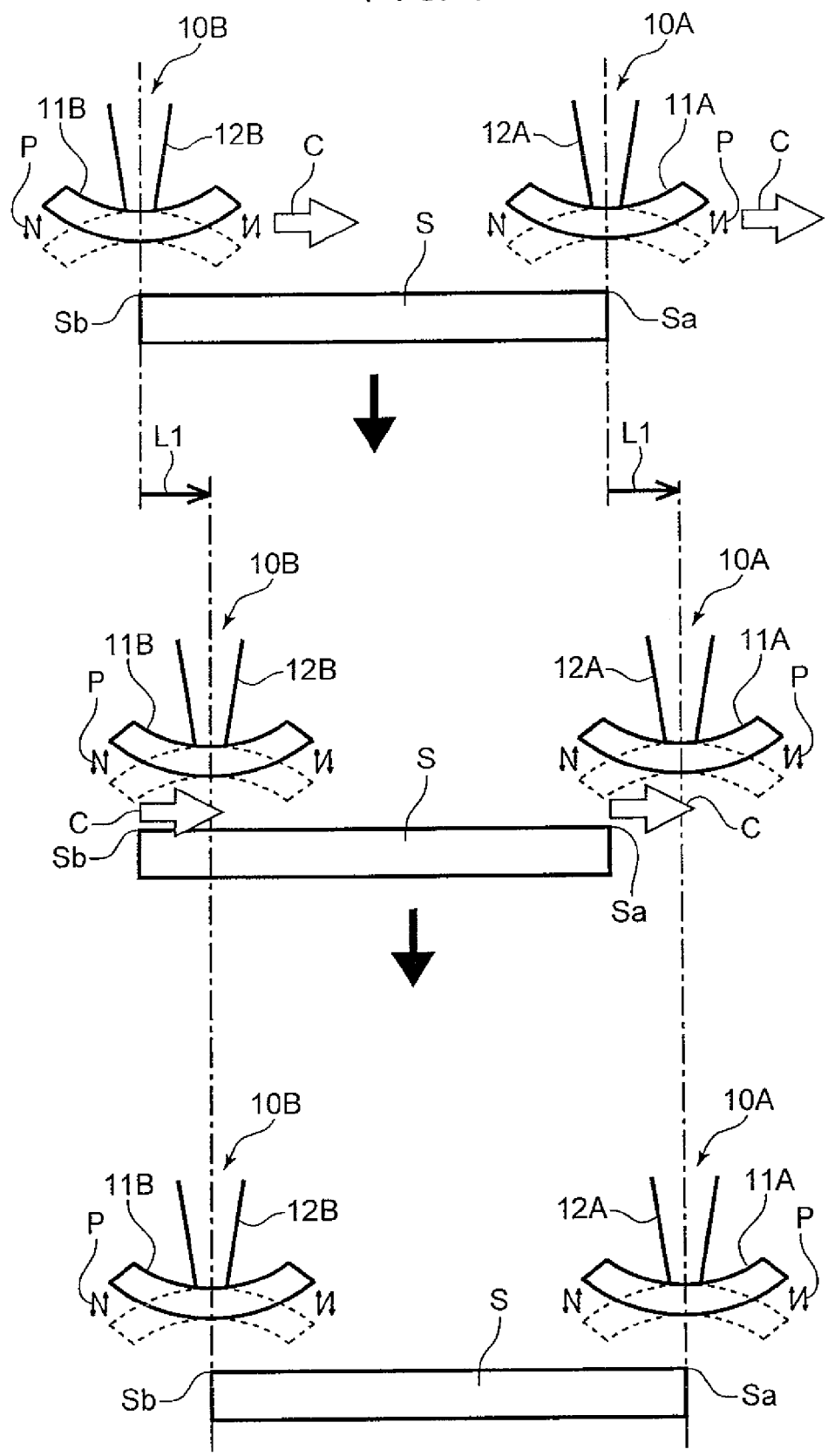
FIG. 4 is an explanatory view illustrating conveying operations of the non-contact conveyance system seen from the direction of the arrow X in FIG. 1.

FIG. 4 is an explanatory view illustrating conveying operations of the non-contact conveyance system seen from the direction of the arrow X in FIG. 1. The respective vibrating plates 11A and 11B excite deflection standing waves P by being applied with the ultrasonic vibration by the actuators 12A and 12B. When the vibrating plates 11A and 11B thus excite the deflection standing waves P, retaining forces of attracting to and retaining at positions facing to the vibrating plates 11A and 11B act on the edge portions Sa and Sb of the conveyance object S.

Specifically, antinodes of the deflection standing waves P are created at parts of the vibrating plates 11A and 11B in contact with the actuators 12A and 12B. Then, negative pressures are maximized in the spaces adjacent to the antinodes of the deflection standing waves P of the vibrating plates 11A and 11B and the retaining forces for retaining the edge portions Sa and Sb of the conveyance object S are maximized (maximum retaining force) at the positions facing to the antinodes of the deflection standing waves P of the vibrating plates 11A and 11B.

The retaining forces acting on the edge portions Sa and Sb of the conveyance object S drop as position deviates from the facing positions in the horizontal direction. Accordingly, while the edge portions Sa and Sb of the conveyance object S may deviate from the positions facing to the actuators, i.e., from the antinodes of the deflection standing waves P, and the retaining forces act on the edge portions Sa and Sb as long as the vibrating plates 11A and 11B face to the edge portions Sa and Sb of the conveyance object S, it is possible to face the edge portions Sa and Sb of the conveyance object S to the antinodes of the deflection standing waves P of the vibrating plates 11A and 11B and to retain the edge portions Sa and Sb of the conveyance object S with the maximum retaining force because the respective actuators 12A and 12B are disposed at intervals facing to the edge portions Sa and Sb in the first embodiment of the invention.

It is noted that this retaining force does not act when the edge Sa or Sb of the conveyance object S deviates from the position facing to the vibrating plate 11 and acts only when the edge portion of the conveyance object S is located at the position facing to the vibrating plate 11.

When the respective conveying units 10A and 10B are moved then in the conveying direction (the direction of the arrow C) by a distance L1 by which the edge portions Sa and Sb of the conveyance object S do not deviate from the positions facing to the vibrating plates 11, the respective edge portions Sa and Sb of the conveyance object S are attracted to positions facing to the antinodes of the deflection standing waves P of the vibrating plates 11 (position where the retaining force is maximized) because the retaining force is being applied to the respective edge portions Sa and Sb of the conveyance object S. Thereby, the conveyance object S is conveyed in the conveying direction (in the direction of the arrow C) following the moves of the respective conveying units 10A and 10B.

Thus, according to the first embodiment, the non-contact conveyance system is arranged so as to be able to convey the conveyance object S by the respective conveying units 10A and 10B in non-contact and to convey the conveyance object S following the moves of the respective conveying units 10A and 10B by moving the respective conveying units 10A and 10B by the moving unit 20, so that it becomes unnecessary to dispose a large number of vibrating plates that excite deflection traveling waves along the conveying direction like the prior art non-contact conveyance system and it becomes possible to downsize the system by cutting a number of parts.

Here, although the conveying unit 10 may be disposed so as to face to at least one edge portion among the front and rear edge portions Sa and Sb of the conveyance object S and the conveyance object S may be conveyed only by the conveying unit 10B by cutting the conveying unit 10A or only by the conveying unit 10A by cutting the conveying unit 10B, the conveying units 10A and 10B are disposed corresponding to the both edge portions Sa and Sb of the conveyance object S in the first embodiment. Accordingly, the retaining force, i.e., conveying force, may be enhanced and the conveyance object S may be conveyed stably.

Figure 5:
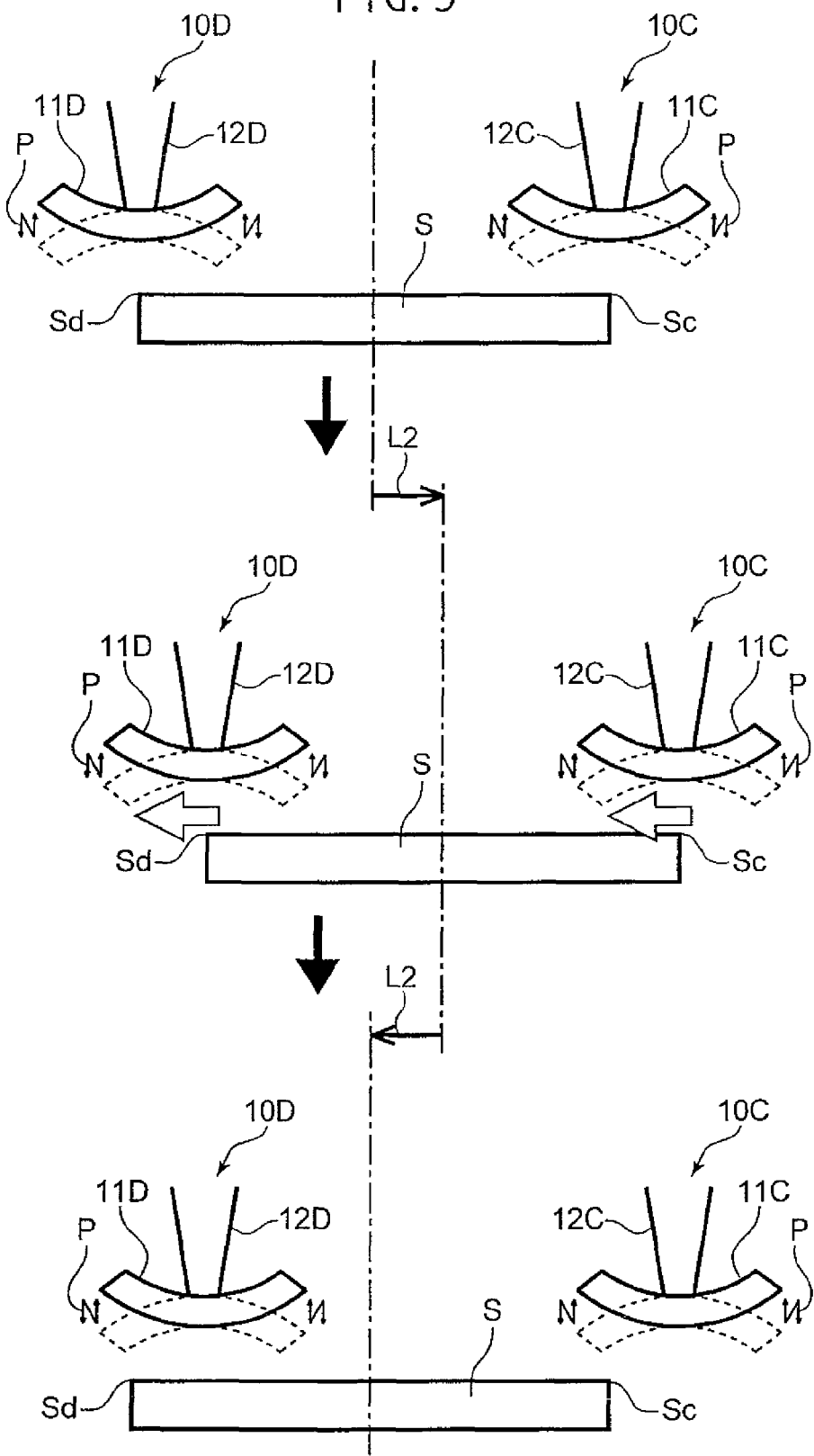
FIG. 5 is an explanatory view illustrating restricting operations of the non-contact conveyance system seen from the direction of an arrow Y in FIG. 1.

Beside the respective conveying units 10A and 10B, the non-contact conveyance system of the first embodiment is also provided with the restricting units 10C and 10D having the same structure. Then, operations of the restricting units 10C and 10D will now be explained. FIG. 5 is an explanatory view illustrating the restricting operations of the non-contact conveyance system seen from the direction of the arrow Y in FIG. 1.

The respective vibrating plates 11C and 11D excite deflection standing waves P by being applied with ultrasonic vibrations by the actuators 12C and 12D. When the vibrating plates 11C and 11D thus excite the deflection standing waves P, retaining forces of attracting to and retaining the conveyance object at positions facing to the vibrating plates 11C and 11D act on the side edge portions Sc and Sd of the conveyance object S. Specifically, antinodes of the deflection standing waves P are created at parts of the vibrating plates 11C and 11D in contact with the actuators 12C and 12D. Then, negative pressures are maximized in the spaces adjacent to the antinodes of the deflection standing waves P of the vibrating plates 11C and 11D and the retaining forces that retain the edge portions Sc and Sd of the conveyance object S are maximized (maximum retaining force) at the positions facing to the antinodes of the deflection standing waves P of the vibrating plates 11C and 11D. The retaining forces acting on the edge portions Sc and Sd of the conveyance object S drop as position deviates from the facing positions in the horizontal direction. Accordingly, while the edge portions Sc and Sd of the conveyance object S may deviate from the facing positions facing to the actuators 12, i.e., from the antinodes of the deflection standing waves P, and the retaining forces act on the edge portions Sc and Sd as long as the vibrating plates 11C and 11D face to the edge portions Sc and Sd of the conveyance object S, it is possible to face the edge portions Sc and Sd of the conveyance object S to the antinodes of the deflection standing waves P of the vibrating plates 11C and 11D and to retain the edge portions Sc and Sd of the conveyance object S with the maximum retaining force because the respective actuators 12C and 12D are disposed at intervals facing to the edge portions Sc and Sd in the first embodiment of the invention. It is noted that this retaining force does not act when the edge Sc or Sd of the conveyance object S deviates from the position facing to the vibrating plate 11 and acts only when the edge Sc or Sd of the conveyance object S is located at the position facing to the vibrating plate 11.

When the conveyance object S moves in the widthwise direction, e.g., when the conveyance object S deviates in the widthwise direction due to unbalanced conveying speeds on the both sides in the widthwise direction of the conveyance object S, the respective edge portions Sc and Sd of the conveyance object S are attracted to the positions (where the retaining force is maximized) facing to the antinodes of the deflection standing waves P of the vibrating plates 11 and the conveyance object S is restricted from moving in the widthwise direction orthogonal to the conveying direction because the retaining forces are being applied to the respective edge portions Sc and Sd of the conveyance object S as long as the moving width L2 is a range in which the edge portions Sc and Sd of the conveyance object S do not deviate from the positions facing to the vibrating plates 11.

Thus, according to the first embodiment of the invention, it is possible to suppress the conveyance object from falling out in non-contact by the restricting units 10C and 10D without providing contact-type guides and to avoid the conveyance object from being stained or damaged otherwise caused by contacts.

Thus, although a large number of restricting units may be arrayed here in the conveying direction, it is needless to dispose such large number of restricting units that excite deflection standing waves along the conveying direction because the restricting units 10C and 10D are moved by the moving unit 20 in the first embodiment. Accordingly, the system may be downsized further by cutting a number of parts.

Here, although the restricting unit may be disposed so as to face to at least one side edge portion among the both side edge portions Sc and Sd of the conveyance object S and the conveyance object may be restricted only by the restricting unit 10D by cutting the restricting unit 10C or only by the restricting unit 10C by cutting the restricting unit 10D, the restricting units 10C and 10D are disposed corresponding to the both edge portions Sc and Sd of the conveyance object S in the first embodiment. Accordingly, the retaining force, i.e., a restricting force, may be enhanced and the conveyance object S may be stably restricted from moving in the widthwise direction.

As described above, the conveying units 10A and 10B as the conveying section and the restricting units 10C and 10D as the restricting sections are moved by the moving unit 20 in the first embodiment of the invention, so that the number of parts may be cut and the conveyance object S may be conveyed stably in the conveying direction while restricting its move in the widthwise direction.

[Second Embodiment]

While the case in which the non-contact conveyance system is provided with the restricting units 10C and 10D as the restricting sections has been explained in the first embodiment described above, a case when the conveying units as the conveying section function also as restricting sections will be explained in a second embodiment. It is noted that the same structures and components of the second embodiment with those of the first embodiment will be denoted by the same reference numerals and explanations thereof will be omitted here.

Figure 6A:
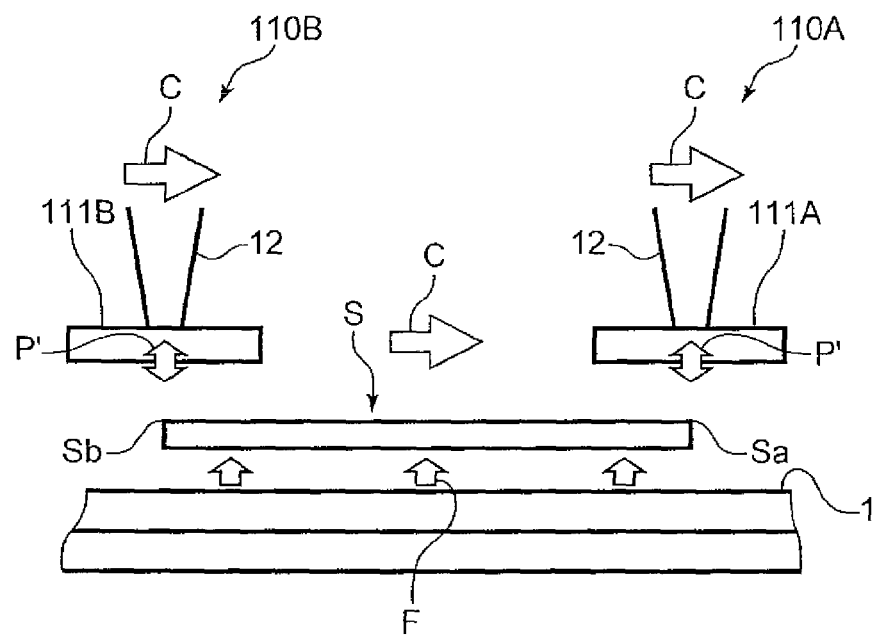
FIGS. 6a and 6b are explanatory views illustrating an outline of a non-contact conveyance system according to a second embodiment of the invention.
Figure 6B:
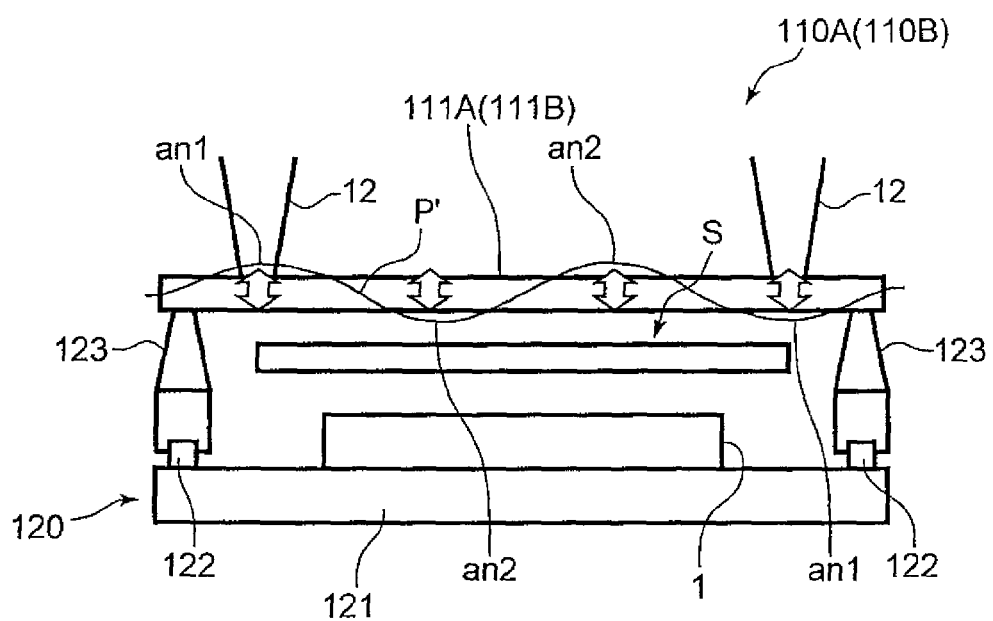

FIGS. 6a and 6b are explanatory views illustrating an outline of the non-contact conveyance system of the second embodiment of the invention, wherein FIG. 6(a) is a view seen from the direction orthogonal to the conveying direction and FIG. 6(b) is a view seen from the conveying direction.

According to the second embodiment, the non-contact conveyance system is provided with a pair of conveying units 110A and 110B as the conveying section. The conveying units 110A and 110B have the same structure and are disposed apart in the conveying direction C by a distance corresponding to a length of the conveyance object S in the conveying direction.

One conveying unit (front edge conveying unit) 110A has a front edge vibrating plate 111A disposed above the static pressure table 1 so as to face to the upper part of the front edge portion Sa of the conveyance object S in non-contact and two (plurality of) front edge actuators 12 that apply vibrations to the front edge vibrating plate 111A to excite deflection standing waves. A distance between the front edge actuators 12 is set to be substantially equal to the length of the conveyance object S in the widthwise direction. In the same manner, the other conveying unit (rear edge conveying unit) 110B has a rear edge vibrating plate 111B disposed above the static pressure table 1 so as to face to the upper part of a rear edge portion Sb of the conveyance object S in non-contact and two rear edge actuators 12 that apply vibrations to the rear edge vibrating plate 111B to excite deflection standing waves. A distance between the rear edge actuators 12 is also set to be substantially equal to the length of the conveyance object S in the widthwise direction.

The respective vibrating plates 111A and 111B are formed by being extended in the widthwise direction so that a length thereof in the widthwise direction is greater than a widthwise length of the conveyance object S. Accordingly, the vibrating plates cover the whole edge portions Sa and Sb when they are faced to the respective edge portions Sa and Sb of the conveyance object S. Then, deflection standing waves P' having a plurality of antinodes in the widthwise direction is excited by the actuators 12. Thereby, retaining forces that attract to and retain the conveyance object at the positions facing to the front edge vibrating plate 111A act on the front edge portion Sa and on the both corners thereof of the conveyance object S and retaining forces that attract to and retain the conveyance object at the positions facing to the rear edge vibrating plate 111B act on the rear edge portion Sb and on the both corners thereof of the conveyance object S.

A moving unit 120 is disposed under the static pressure table 1 and is provided with a base 121 on which the static pressure table 1 is placed, a pair of guide rails 122 provided on the both widthwise sides of the base 121 and extended in the conveying direction and a pair of sliders 123 that are fixed to the respective vibrating plates 111A and 111B and that slidably contact with the guide rails 122. Then the respective conveying units 110A and 110B move along the guide rails 122. It is noted that nodes of the deflection standing waves P' are located at the parts where the respective vibrating plates 111A and 111B are fixed with the sliders 123.

Further, the antinodes an1 of the deflection standing waves P' are formed at the parts where the actuators 12 contact and are secured to the respective vibrating plates 111A and 111B. Other antinodes an2 are also formed between the antinodes an1 of the deflection standing waves P'. That is, the conveying units are designed so that numbers of antinodes of the deflection standing waves P' in the vibrating plates 111A and 111B become at least three or more.

Similarly to the first embodiment, negative pressure is maximized at spaces adjacent to the respective antinodes ant, an1, an2 and an2 of the deflection standing waves P' and the retaining forces may be applied to the respective edge portions Sa and Sb of the conveyance object S by facing the front edge vibrating plate 111A to the front edge portion Sa of the conveyance object S and the rear edge vibrating plate 111B to the rear edge portion Sb of the conveyance object S.

Here, the both corners of the respective edge portions Sa and Sb of the conveyance object S face to the antinodes an1 of the deflection standing waves P' of the vibrating plates 111A and 111B. That is, the antinodes an1 of the deflection standing waves P' of the vibrating plates 111A and 111B apply the maximum retaining forces to the corners of the conveyance object S. That is, according to the second embodiment, the four corners of the conveyance object S are retained by the deflection standing waves P' of the respective vibrating plates 111A and 111B. It is noted that while the corners of the conveyance object S may deviate from the positions facing to the antinodes of the deflection standing waves P' and the retaining forces act on the corners of the conveyance object S as long as the vibrating plates 111A and 111B face to the edge portions Sa and Sb and the corners of the conveyance object S, the antinodes of the deflection standing waves P' of the vibrating plates 111A and 111B are faced to the corners of the conveyance object S in the second embodiment, so that it is possible to retain the corners of the conveyance object S with the maximum retaining force.

During when the respective conveying units 110A and 110B are moved in the conveying direction C in this state, the retaining forces are applied to the edge portions Sa and Sb of the conveyance object S by the respective antinodes an1, an1, an2 and an2 of the standing waves P of the vibrating plates 111A and 111B, so that the conveyance object S is conveyed in the conveying direction C following the move of the respective conveying units 110A and 110B. Because the antinodes of the deflection standing waves P' are thus formed across the vibrating plates in the widthwise direction and the respective edge portions are retained by the retaining forces, the conveyance object S may be stably conveyed even if it is large in size.

Still more, because the retaining forces are being applied to the corners of the conveyance object S by the respective antinodes an1 and an1 of the deflection standing waves P' of the vibrating plates 111A and 111B, the conveyance object S may be restricted from moving in the widthwise direction.

Because the respective conveying units 110A and 110B have the function of restricting the conveyance object S from moving in the widthwise direction as described above in the second embodiment, it is not necessary to provide other restricting units like the first embodiment. Therefore, a number of parts may be cut and the system may be downsized. Still more, because the conveyance object S may be suppressed from falling out in non-contact without providing contact-type guides, it is possible to avoid the conveyance object S from being stained or damaged otherwise caused by contact.

Here, although the conveying unit 110 may be disposed so as to face to at least one edge portion among the front and rear edge portions Sa and Sb of the conveyance object S and the conveyance object S may be conveyed only by the conveying unit 110B by cutting the conveying unit 110A or only by the conveying unit 110A by cutting the conveying unit 110B, the conveying units 110A and 110B are disposed corresponding to the both edge portions Sa and Sb of the conveyance object S in the second embodiment. Accordingly, the retaining force, i.e., a conveying force, may be enhanced and the conveyance object S may be conveyed stably while restricting its move in the widthwise direction.

[Third Embodiment]

Figure 7:
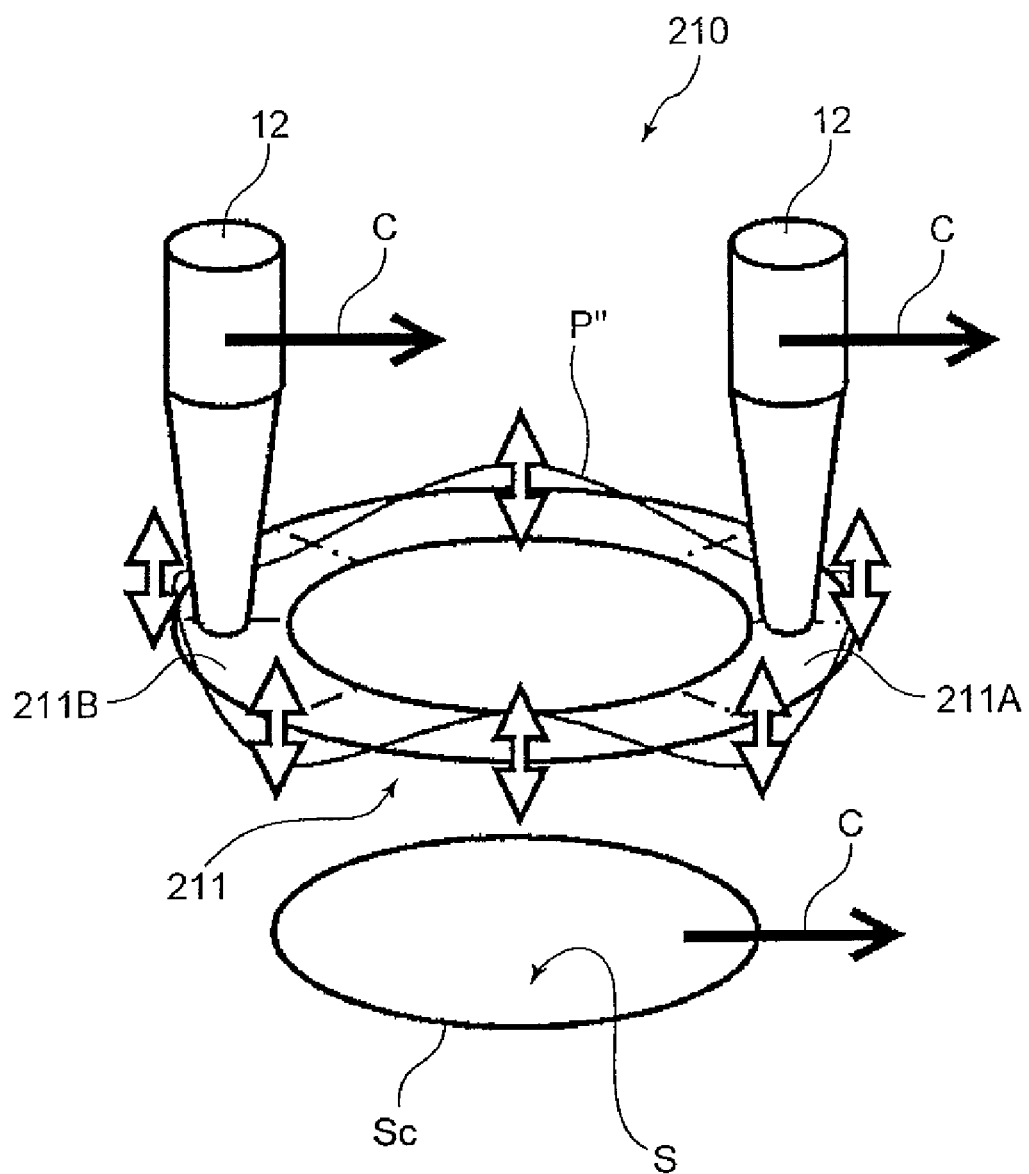
FIG. 7 is an explanatory view illustrating an outline of a non-contact conveyance system according to a third embodiment of the invention.

A different embodiment obtained by modifying the embodiments of the non-contact conveyance system described above will be explained further. FIG. 7 is an explanatory view illustrating an outline of the non-contact conveyance system according to a third embodiment of the invention. It is noted that the same structures and components of the third embodiment with those of the embodiments will be denoted by the same reference numerals and explanations thereof will be omitted here.

According to the third embodiment, a conveying unit 210 as the conveying section has a ringed vibrating plate 211, as a vibrating plate, formed into the shape of a ring so as to face to a circumferential edge portion Sc of the conveyance object S by linking a front edge vibrating plate 211A with a rear edge vibrating plate 211B.

It is noted that the ringed vibrating plate 211 is formed into the shape of a ring corresponding to a conveyance object S whose shape is disk-like in the description of the third embodiment.

The conveying unit 210 has two (plurality of) actuators 12 for causing the ringed vibrating plate 211 to excite deflection standing waves P'''. The deflection standing waves P''' are excited in the ringed vibrating plate 211 in the circumferential direction by these actuators 12. Then, retaining forces for attracting to and retaining at the position facing to the ringed vibrating plate 211 act on the circumferential edge portion Sc of the conveyance object S by exciting the deflection standing waves P''' in the circumferential direction of the ringed vibrating plate 211 by the actuators 211 while facing the circumferential edge portion Sc of the conveyance object S to the ringed vibrating plate 211. That is, the deflection standing waves P''' of the ringed vibrating plate 211 have a plurality of antinodes and when the ringed vibrating plate 211 is faced to the circumferential edge portion Sc of the conveyance object S, the retaining forces caused by the plurality of antinodes of the deflection standing waves P''' act on the circumferential edge portion Sc of the conveyance object S.

When the conveying unit 210 is moved in the conveying direction C in this state, the conveyance object S is conveyed in the conveying direction C following the move of the conveying unit 210 because the deflection standing waves P''' are being excited in the ringed vibrating plate 211 and the retaining forces are being applied to the circumferential edge portion Sc of the conveyance object S.

Still more, because the deflection standing waves P''' are excited in the circumferential direction of the ringed vibrating plate 211 and the retaining forces are applied to the conveyance object S, it is possible to restrict the conveyance object S from moving in the widthwise direction.

Here, the two actuators 12 are disposed so that their edges face respectively to corresponding edge portions among front and rear edge portions of the conveyance object S. That is, the actuators 12 are disposed so that the front and rear edge portions of the conveyance object S face to the antinodes of the deflection standing waves P'''. Thereby, the antinodes of the deflection standing waves P''' of the ringed vibrating plate 211 face steadily to the front and rear edge portions of the conveyance object S, so that a strong conveying force may be obtained in moving the conveying unit 210 in the conveying direction C.

Because the conveying unit 210 having the ringed vibrating plate 211 can restrict the conveyance object S from moving in the widthwise direction as described above in the third embodiment, it is not necessary to provide other restricting units like the first embodiment. Therefore, a number of parts may be cut and the system may be downsized. Still more, because the conveyance object S may be suppressed from falling out in non-contact without providing contact-type guides, it is possible to avoid the conveyance object S from being stained or damaged otherwise caused by contact.

It is noted that while the invention has been explained based on the first through third embodiments described above, the invention is not limited to them.

For example, although the cases in which the static pressure table 1 is used as the levitating section have been explained in the embodiments described above, the invention is not limited to that and the levitating section may be an electrostatic levitating unit or a magnetic levitating unit.

Still more, although the cases in which the conveyance object is a rectangular or disk-shaped flat plate have been explained in the embodiments described above, the invention is not limited to them and is applicable to a flat plate having any shape.

The non-contact conveyance system of the invention may be used for conveying flat panels in non-contact and may be preferably used for conveying mother glass substrates for use as flat panel displays, semiconductor wafers and the like in particular.

The invention claimed is:

1. A non-contact conveyance system for conveying a conveyance object in a conveying direction, comprising:
a levitating section for levitating the conveyance object upward;
a moving section that moves in the conveying direction;
a conveying section having a vibrating plate disposed so as to face to the conveyance object in non-contact and an actuator for applying vibrations to said vibrating plate to excite deflection standing waves;
said conveying section being supported by said moving section;
said conveying section applying a retaining force that attracts to and retains the conveyance object at position facing to said vibrating plate to at least one edge portion among front and rear edge portions of the conveyance object facing to said vibrating plate by exciting deflection standing waves in said vibrating plate by said actuator; and
said moving section moving said conveying section in the conveying direction to convey said conveyance object in the conveying direction following the move of said conveying section while applying the retaining force to the edge portion of the conveyance object.

2. The non-contact conveyance system according to claim 1, wherein said conveying section has, as said vibrating plate, a front edge vibrating plate disposed so as to face to the front edge portion of the conveyance object and a rear edge vibrating plate disposed so as to face to the rear edge portion of the conveyance object.

3. The non-contact conveyance system according to claim 2, wherein said front edge and rear edge vibrating plates are linked to form a ringed vibrating plate into the shape of a ring so as to face to a circumferential edge portion of the conveyance object in non-contact;
said conveying section applies retaining forces that attract to and retain the conveyance object at positions facing to said ringed vibrating plate to the circumferential edge portion of the conveyance object facing to said ringed vibrating plate by exciting deflection standing waves having a plurality of antinodes in the circumferential direction in said ringed vibrating plate by said actuators;
said moving section moves said conveying section in the conveying direction to convey said conveyance object in the conveying direction following the move of said conveying section while applying the retaining forces to the circumferential edge portion of the conveyance object; and
said conveying section restricts the conveyance object from moving in a widthwise direction orthogonal to the conveying direction.

4. The non-contact conveyance system according to claim 1, further comprising a restricting section having side edge vibrating plates disposed so as to face to side edge portions of the conveyance object in non-contact and side edge actuators for applying vibrations to said side edge vibrating plates to excite deflection standing waves;
wherein said restricting section restricts the conveyance object from moving in a widthwise direction orthogonal to the conveying direction by applying retaining forces that attract to and retain the conveyance object at positions facing to said side edge vibrating plates to the side edge portions of the conveyance object facing to said side edge vibrating plates by exciting the deflection standing waves in said side edge vibrating plates by said side edge actuators.

5. The non-contact conveyance system according to claim 4, wherein said moving section supports said restricting sections and moves said restricting sections together with said conveying section in the conveying direction.

6. The non-contact conveyance system according to any one of claim 1, wherein said vibrating plate extends in a widthwise direction orthogonal to the conveying direction so as to cover the whole edge portion of the conveyance object;
said conveying section applies a retaining force that attracts to and retains the conveyance object at a position facing to said vibrating plate to edge portion of the conveyance object facing to said vibrating plate by exciting deflection standing waves having a plurality of antinodes in the widthwise direction of said vibrating plate by said actuator;

said moving section moves said conveying section in the conveying direction to convey said conveyance object in the conveying direction following the move of said conveying section while applying the retaining force to the edge portion of the conveyance object; and said conveying section applies the retaining forces to corners of the edge portion of the conveyance object to restrict the conveyance object from moving in the widthwise direction orthogonal to the conveying direction.

* * * * *